United States Patent [19]
Yoo

[11] Patent Number: 5,640,362
[45] Date of Patent: Jun. 17, 1997

[54] LEAD FRAME CLOCK DISTRIBUTION FOR INTEGRATED CIRCUIT MEMORY DEVICES

[75] Inventor: Seung-moon Yoo, Kyungki-do, Rep. of Korea

[73] Assignee: Samsung Electronics Co., Ltd., Suwon, Rep. of Korea

[21] Appl. No.: 701,702

[22] Filed: Aug. 22, 1996

[30] Foreign Application Priority Data

Aug. 31, 1995 [KR] Rep. of Korea .................... 95-28411

[51] Int. Cl.⁶ .................................................. G11C 13/00
[52] U.S. Cl. ........................ 365/233; 365/51; 365/189.04
[58] Field of Search ............................... 365/51, 189.04, 365/230.06, 230.08, 233

[56] References Cited

U.S. PATENT DOCUMENTS 5,499,216  3/1996  Yamamoto ................ 365/230.06

Primary Examiner—Terrell W. Fears
Attorney, Agent, or Firm—Bell, Seltzer, Park & Gibson

[57] ABSTRACT

Clock pads are distributed over an integrated circuit memory device and electrically connected to a lead frame to synchronously provide an external clock signal to the clock pads. Accordingly, an internal clock signal is generated throughout the integrated circuit memory device by distributing an external clock signal using a lead frame and pads. Internal circuitry for generating and synchronizing an internal clock from an external clock is thereby not required. When the integrated circuit memory device includes multiple memory array banks, the clock pads may be located in a row of input/output pads adjacent a memory array bank or between pairs of memory array banks.

10 Claims, 1 Drawing Sheet

LEAD FRAME CLOCK DISTRIBUTION FOR INTEGRATED CIRCUIT MEMORY DEVICES

FIELD OF THE INVENTION

This invention relates to integrated circuit devices, and more particularly, to clock distribution methods and systems for integrated circuit devices, such as integrated circuit memory devices.

BACKGROUND OF THE INVENTION

Integrated circuit devices continue to increase in performance, density and speed, with increasing advances in integrated circuit design and manufacturing. For example, Dynamic Random Access Memory (DRAM) integrated circuit memory devices have continued to provide lower power, lower cost and higher bandwidth. High bandwidth is important in order to obtain high speed read and write operations of the memory device.

One important aspect of obtaining high bandwidth is controlling the system clock of the DRAM. In particular, a DRAM typically includes a circuit which converts an external system clock into an internal clock which is used throughout the integrated circuit. High speed, synchronous operation of the internal system clock is important because internal operations of the DRAM are generally synchronized to the internal clock. Thus, a faster internal clock generally allows faster operation of the DRAM device.

As an example, if the time consumed for generating the internal clock from the external clock is about two nanoseconds, the actual time for operating an internal circuit using the internal clock is also generally about two nanoseconds. In this scenario, address hold times may need to be at least four nanoseconds. Accordingly, the operational speed of an integrated circuit device, and in particular an integrated circuit memory device, is generally dependent upon the speed in which an internal clock may be synchronously generated, and the synchronization accuracy of the internal clock throughout the integrated circuit. High speed synchronous generation of an internal clock throughout an integrated circuit is therefore desirable.

SUMMARY OF THE INVENTION

It is therefore an object of the invention to provide improved clock generation systems and methods for integrated circuit devices such as integrated circuit memory devices.

It is another object of the present invention to provide internal clock distribution for integrated circuit devices can reduce delay times.

These and other objects are provided according to the present invention, by distributing a plurality of clock pads over an integrated circuit and electrically connecting the plurality of clock pads with a lead frame, to synchronously provide an external clock signal to the plurality of clock pads. Accordingly, the internal clock signal is generated throughout the integrated circuit by distributing an external clock signal using a lead frame and pads. Internal circuitry for generating and synchronizing an internal clock from an external clock is thereby not required. High speed, synchronous clock distribution may thereby be obtained.

An integrated circuit memory device according to the present invention includes an integrated circuit having a plurality of memory array banks. A plurality of input/output pads are located adjacent each of the memory array banks. The plurality of input/output pads transmit information between the associated memory bank and external to the integrated circuit. A plurality of clock pads are provided. At least one clock pad is located adjacent a respective one of the memory array banks. The plurality of clock pads each synchronously receive an external clock signal with synchronizes operations of a plurality of memory array banks. A lead frame electrically connects the plurality of clock pads to one another, to synchronously provide the external clock signal to the plurality of clock pads.

In a preferred embodiment of the present invention, the plurality of input/output pads comprise a row of input/output pads adjacent each of the memory banks. A respective one of the clock pads is located in the middle of a respective row of input/output pads. The integrated circuit is preferably free of a Phase Lock Loop or other circuit which is conventionally required to generate an internal clock signal from the external clock signal. Accordingly, reduced power consumption may also be obtained.

Clock distribution according to the present invention is advantageously used in an integrated circuit memory device which includes a plurality of pairs of memory array banks. Each pair of memory array banks comprises an upper memory bank adjacent a first edge of the integrated circuit and a lower memory bank adjacent a second edge of the integrated circuit, opposite the first edge. A plurality of input/output pads are located between each of the pairs of memory array banks. The plurality of input/output pads transmit information between the associated pair of memory banks and external to the integrated circuit. A plurality of clock pads is also provided. At least one of the clock pads is located between a respective one of the pairs of memory array banks. A lead frame electrically connects the plurality of clock pads to one another, to synchronously provide an external clock signal to the plurality of clock pads.

The plurality of input/output pads preferably comprises a row of input/output pads between each of the pair of memory banks. The row of input/output pads extends parallel to the first edge. A respective one of the clock pads is located in the middle of a respective row of input/output pads. A lead frame also preferably extends parallel to the first edge between each pair of memory array banks. Operational speed may thereby be improved and power consumption may be reduced.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
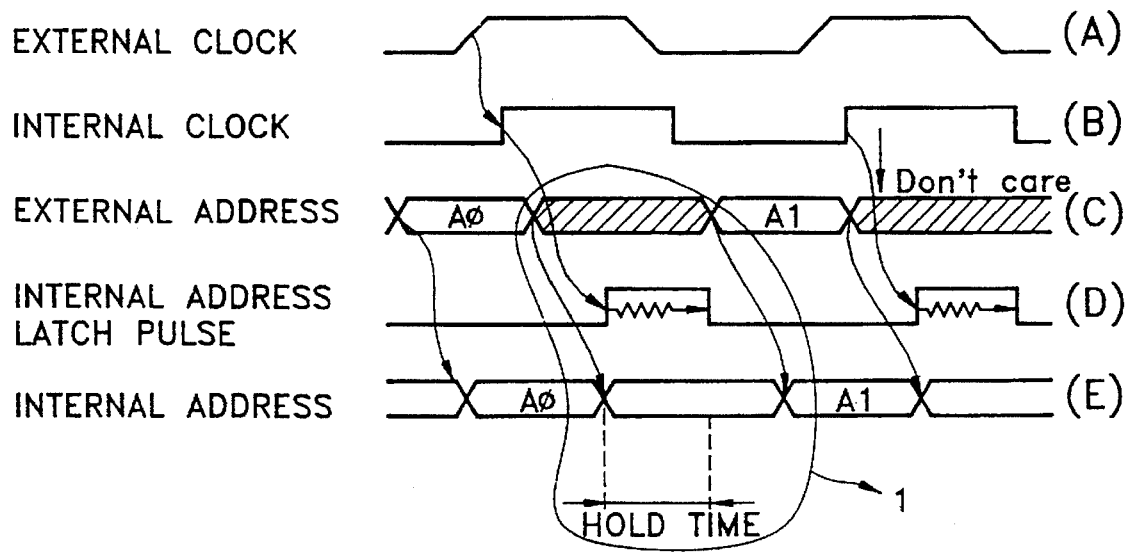
FIG. 3 is a timing diagram of signals which are used in an integrated circuit memory device.

Referring first to FIG. 3, a timing diagram of signals used in a synchronous semiconductor memory device is illustrated. These timing signals will be used to describe the problem of clock synchronization in a conventional memory device.

As shown in FIG. 3, an internal clock is generated in the integrated circuit from an external clock. An address signal is input into an address buffer before the rising edge of the internal clock occurs. An internal address signal is continuously output from the address buffer. However, even though the internal address signal is generated earlier than the internal address latch pulse D, the internal address signal generally needs to be maintained for the duration of the width of the internal address latch.

Problems may occur with the timing of FIG. 3 when high speed memory devices are used. For example, problems may occur when using system clock frequencies higher than 125 MHz. In particular, it may take two nanoseconds (½ cycle) if the system clock frequency is 250 MHz and data other than the address is transmitted during a rising or falling edge of the system clock or is fetched from the memory device. This time is almost identical to the minimum data hold time. Since the minimum data hold time generally increases when the operating temperature of the memory device increases, or the memory device begins to deteriorate, improper operation of the memory device may occur with a data hold time of two nanoseconds.

Integrated circuit memory devices often employ Phase Lock Loop (PLL) circuits to solve this problem. A PLL circuit can generate an internal clock signal having the same frequency as an external clock signal using a feedback operation. Accordingly, when using a Phase Lock Loop circuit, operational speed of the device may be improved and the time which is required to maintain an internal address may be decreased by reducing the time that is required to generate the clock signal. This clock signal generating time often requires conversion of an interface logic signal such as a TTL logic signal to an internal logic level such as a CMOS logic level.

Unfortunately, the use of Phase Lock Loop circuitry may produce its own problems. First, power consumption of the integrated circuit device may increase. The current which is consumed by the Phase Lock Loop can be up to several milliamperes. This current may be significant compared to the current which is consumed by the remainder of the integrated circuit memory device. For example, in a conventional four megabit DRAM device, the current consumed by the Phase Lock Loop may be almost equal to the entire remaining operating current of the device.

Moreover, the Phase Lock Loop may also create delays in activating the memory from a sleep mode to a normal operational mode, because the Phase Lock Loop is generally not used for a long time during sleep mode in order to reduce the current consumption of the device. When reactivating the Phase Lock Loop, it may take a long time to obtain the first data after a first data request to the memory device. For example, in a four megabit DRAM, it may take 70 nanoseconds to obtain data, but the Phase Lock Loop settling time may be on the range of several microseconds. Accordingly, the Phase Lock Loop may degrade operating speed of the device.

A Phase Lock Loop may also consume a significant portion of the "real estate" of the integrated circuit which could otherwise be used by active memory cell arrays. Finally, as the integration density of the semiconductor memory device increases, the Phase Lock Loop generally experiences larger loads, and it may be difficult to generate the internal clock signal due to the larger loads of, for example, a one gigabit DRAM. Accordingly, when the memory size increases, it may become increasingly difficult to obtain the correct internal clock signal using a Phase Lock Loop circuit. It may also become difficult to avoid internal clock signal delays and increased power consumption.

Figure 1:
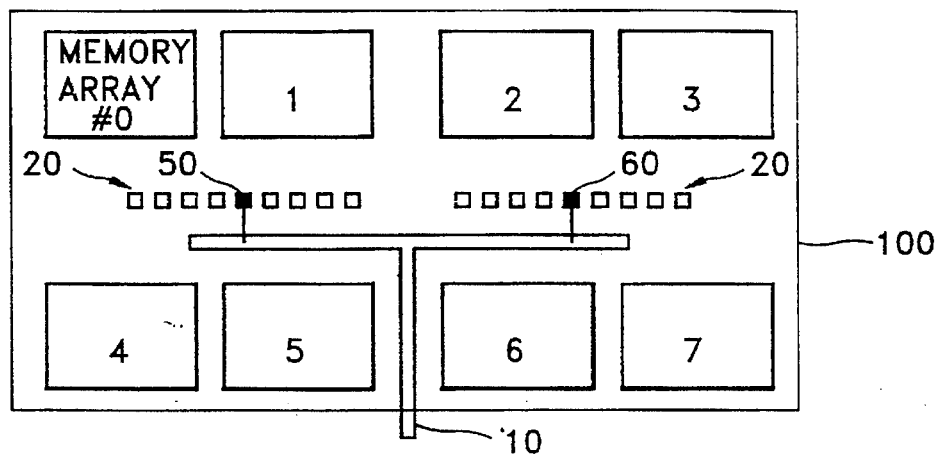
FIG. 1 is a block diagram of an integrated circuit memory device according to a first embodiment of the present invention.
Figure 2:
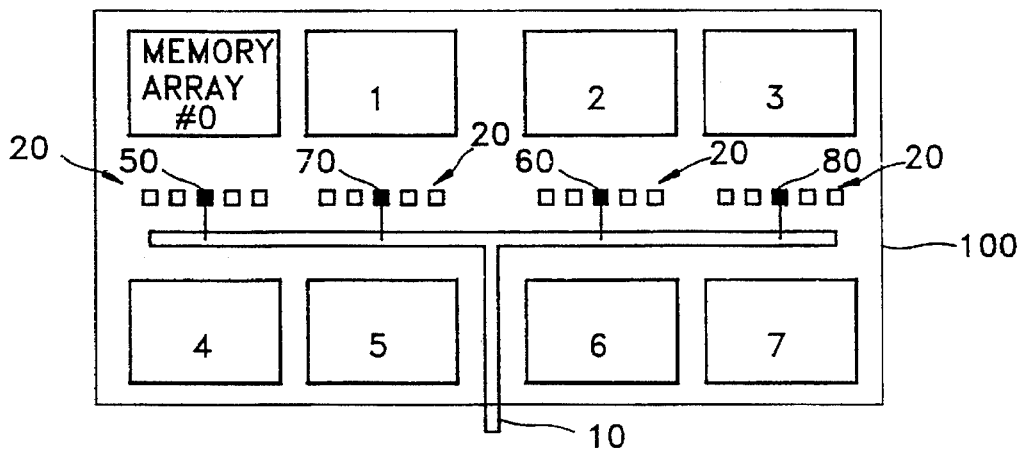
FIG. 2 is a block diagram of an integrated circuit memory device according to a second embodiment of the present invention.

The present invention can solve these and other clock distribution problems. First and second preferred embodiments of the present invention are illustrated in FIGS. 1 and 2. Referring now to FIG. 1, an integrated circuit memory device includes an integrated circuit 100 having a plurality, here eight, of memory array banks 0–7 arranged in an array in the upper and lower portions of the integrated circuit. As shown, upper memory banks 0, 1, 2 and 3 are adjacent a first edge of the integrated circuit 100 and lower memory banks 4, 5, 6 and 7 are adjacent a second edge of the integrated circuit 100, opposite the first edge.

Still referring to FIG. 1, eight input/output pads 20 are arranged between pairs of upper and lower memory banks. Thus, for example, eight input/output pads 20 are arranged between upper memory banks 0 and 1 and lower memory banks 4 and 5. Similarly, eight input/output pads 20 are arranged between upper memory banks 2 and 3 and lower memory banks 6 and 7.

As shown in FIG. 1, a plurality of clock pads are also provided. At least one clock pad is adjacent a respective one of the memory array banks. Thus, clock pad 50 is adjacent memory array banks 0, 1, 4 and 5, and clock pad 60 is adjacent memory array banks 2, 3, 6 and 7.

A lead frame 10 is also provided which electrically connects the plurality of clock pads 50 and 60 to one another to synchronously provide an external clock signal which synchronizes operations of the plurality of memory array banks, to the plurality of clock pads 50 and 60. The lead frame transmits the external clock signal to the interior of the integrated circuit device 100, via the clock pads 50 and 60, when connected to an external clock.

FIG. 2 shows a second embodiment of a synchronous integrated circuit memory device. As shown in FIG. 2, input/output pads are arranged in groups of four for each pair of memory array banks. Accordingly, four data input/output pads are arranged between the pair of memory array banks 0 and 4. Four memory array pads 20 are arranged between upper and lower memory array banks 1 and 5. Four memory array pads 20 are arranged between upper and lower memory array banks 2 and 6. Finally, four memory array pads 20 are arranged between upper and lower memory array banks 3 and 7. In FIG. 2, four clock pads 50, 70, 60 and 80 are provided, with one clock pad being provided for each pair of memory array banks. Lead frame 10 electrically connects the four clock pads 50, 70, 60 and 80 to synchronously provide an external clock signal to the plurality of clock pads.

As illustrated in FIGS. 1 and 2, the input/output pads preferably are arranged in a row of input/output pads, adjacent each of the memory banks. In a preferred embodiment, the clock pad for the memory bank is located in the middle of a respective row of input/output pads. Most preferably, the input/output pads comprise a row of input/output pads between each pair of memory banks which extend parallel to the first edge of the integrated circuit, and a respective clock pad is located in the middle of a respective row of input/output pads. The lead frame 10 also preferably extends parallel to the first edge between each pair of memory array banks.

Accordingly, as shown in FIGS. 1 and 2, the clock pads are distributively arranged over the integrated circuit. The time for generating the internal clock signal from the external clock signal may thereby be decreased, since the clock pads 50, 60, 70 and 80 are directly connected to the external system clock through the lead frame 10. The operational speed of the entire integrated circuit memory device can thereby be improved. The current consumption of the integrated circuit memory device may also be reduced by using a lead frame, and by not requiring the use of a Phase Lock Loop. Accordingly, integrated circuit memory devices according to the present invention may be free of a Phase Lock Loop which generates an internal clock signal from the external clock signal. Thus, operational speed may be improved and current consumption may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:

an integrated circuit having a plurality of memory array banks;

a plurality of input/output pads adjacent each of said memory array banks, which transmit information between the associated memory bank and external to the integrated circuit;

a plurality of clock pads, at least one of which is adjacent a respective one of said memory array banks, said plurality of clock pads each synchronously receiving an external clock signal which synchronizes operations of said plurality of memory array banks; and a lead frame which electrically connects said plurality of clock pads to one another, to synchronously provide said external clock signal to said plurality of clock pads.

2. An integrated circuit memory device according to claim 1 wherein said plurality of input/output pads comprises a row of input/output pads adjacent each of said memory banks, and wherein a respective one of said clock pads is located in the middle of a respective row of input/output pads.

3. An integrated circuit memory device according to claim 1 wherein said integrated circuit comprises a plurality of pairs of memory array banks, and wherein at least one input/output pad and at least one clock pad are between each pair of memory array banks.

4. An integrated circuit memory device according to claim 1 wherein said integrated circuit is free of a phase locked loop which generates an internal clock signal from said external clock signal.

5. An integrated circuit memory device comprising:

an integrated circuit having a plurality of pairs of memory array banks, each pair of memory array banks comprising an upper memory bank adjacent a first edge of said integrated circuit, and a lower memory bank adjacent a second edge of said integrated circuit which is opposite said first edge;

a plurality of input/output pads between each of said pairs of memory array banks, which transmit information between the associated pair of memory banks and external to the integrated circuit;

a plurality of clock pads, at least one of which is between a respective one of said pairs of memory array banks, said plurality of clock pads each synchronously receiving an external clock signal which synchronizes operations of said plurality of pairs of memory array banks; and a lead frame which electrically connects said plurality of clock pads to one another, to synchronously provide said external clock signal to said plurality of clock pads.

6. An integrated circuit memory device according to claim 5 wherein said plurality of input/output pads comprises a row of input/output pads between each of said pair of memory banks, extending parallel to said first edge, and wherein a respective one of said clock pads is located in the middle of a respective row of input/output pads.

7. An integrated circuit memory device according to claim 6 wherein said lead frame extends parallel to said first edge, between each pair of memory array banks.

8. An integrated circuit memory device according to claim 5 wherein said integrated circuit is free of a phase locked loop which generates an internal clock signal from said external clock signal.

9. A method of distributing an external clock to an integrated circuit comprising the step of:

electrically connecting a plurality of clock pads, which are distributed over the integrated circuit, to a lead frame, to synchronously provide an external clock signal to said plurality of clock pads.

10. A method according to claim 9 wherein said integrated circuit is an integrated circuit memory device having a plurality of memory array banks therein, and wherein said step of electrically connecting comprises the step of:

electrically connecting a plurality of clock pads, at least one of which is located adjacent a respective one of said memory array banks, with a lead frame, to synchronously provide an external clock signal to said plurality of memory array banks.

* * * * *